United States Patent
Kuczynski et al.

(10) Patent No.: US 9,090,004 B2
(45) Date of Patent: Jul. 28, 2015

(54) COMPOSITES COMPRISED OF ALIGNED CARBON FIBERS IN CHAIN-ALIGNED POLYMER BINDER

(71) Applicant: International Business Machines Corporation, Armonk, NY (US)

(72) Inventors: Joseph Kuczynski, Rochester, MN (US); Amanda E. Mikhail, Rochester, MN (US); Arden L. Moore, Cedar Park, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/760,682

(22) Filed: Feb. 6, 2013

(65) Prior Publication Data

US 2014/0217574 A1     Aug. 7, 2014

(51) Int. Cl.
*H01L 23/34* (2006.01)
*H01L 23/427* (2006.01)
(Continued)

(52) U.S. Cl.
CPC ......... *B29C 47/0057* (2013.01); *B29C 47/1045* (2013.01); *B29C 47/402* (2013.01); *H01L 23/373* (2013.01); *H01L 23/3737* (2013.01); *H01L 23/42* (2013.01); *H01L 24/29* (2013.01);
(Continued)

(58) Field of Classification Search
CPC .............. H01L 23/373; H01L 2224/2929; H01L 2225/06541; H01L 2225/06589
USPC ................. 438/118–122
See application file for complete search history.

(56) References Cited

U.S. PATENT DOCUMENTS 4,882,399 A    11/1989    Tesoro et al.
5,506,753 A    4/1996     Bertin et al.
(Continued)

FOREIGN PATENT DOCUMENTS

JP    2002273741 A    9/2002
JP    2006193836 A    7/2006
(Continued)

OTHER PUBLICATIONS

Baker, R.T.K., "Synthesis, properties and applications of graphite nanofibers," Published: Jan. 1998; WTEC Hyper-Librarian, www.wtec.org/loyola/nano/us_r_n_d/09_03.htm. Downloaded May 4, 2011.
(Continued)

*Primary Examiner* — Cuong Q Nguyen
(74) *Attorney, Agent, or Firm* — Stachler Intellectual Property LLC

(57) ABSTRACT

A method for enhancing internal layer-layer thermal interface performance and a chip stack of semiconductor chips using the method. The method includes adding a thermosetting polymer to the thermal interface material, dispersing a plurality of nanofibers into the thermal interface material, and un-crosslinking the thermosetting polymer in the thermal interface material. The method further includes extruding the thermal interface material through a die to orient the conductive axis of the nanofibers and polymer chains in the desired direction, and re-crosslinking the thermosetting polymer in the thermal interface material. The chip stack includes a first chip with circuitry on a first side, a second chip coupled to the first chip by a grid of connectors, and a thermal interface material pad between the chips. The thermal interface includes nanofibers and a polymer that allows for optimal alignment of the nanofibers and polymer chains.

16 Claims, 6 Drawing Sheets

(51) Int. Cl.
| | |
|---|---|
| *B29C 47/00* | (2006.01) |
| *H01L 23/373* | (2006.01) |
| *H01L 23/42* | (2006.01) |
| *H01L 25/065* | (2006.01) |
| *B29C 47/10* | (2006.01) |
| *B29C 47/40* | (2006.01) |
| *H01L 23/00* | (2006.01) |
| *B29K 105/16* | (2006.01) |

(52) U.S. Cl.
CPC ............ *H01L 24/83* (2013.01); *H01L 25/0657* (2013.01); *B29K 2105/162* (2013.01); *B29K 2995/0013* (2013.01); *H01L 2224/2929* (2013.01); *H01L 2224/29393* (2013.01); *H01L 2224/29499* (2013.01); *H01L 2224/32245* (2013.01); *H01L 2224/8385* (2013.01); *H01L 2225/06513* (2013.01); *H01L 2225/06541* (2013.01); *H01L 2225/06589* (2013.01); *H01L 2924/0002* (2013.01)

(56) References Cited

U.S. PATENT DOCUMENTS

| | | | |
|---|---|---|---|
| 5,912,282 | A | 6/1999 | Iyer et al. |
| 6,407,922 | B1 | 6/2002 | Eckblad et al. |
| 6,537,515 | B1 | 3/2003 | Baker et al. |
| 6,721,796 | B1 | 4/2004 | Wong |
| 6,730,731 | B2 | 5/2004 | Tobita et al. |
| 6,741,019 | B1 | 5/2004 | Filas et al. |
| 6,764,759 | B2 | 7/2004 | Duvall et al. |
| 6,790,425 | B1 | 9/2004 | Smalley et al. |
| 6,891,724 | B2 | 5/2005 | De Lorenzo et al. |
| 6,965,513 | B2 | 11/2005 | Montgomery et al. |
| 7,189,778 | B2 | 3/2007 | Tobita et al. |
| 7,238,415 | B2 | 7/2007 | Rodriguez et al. |
| 7,270,795 | B2 | 9/2007 | Kawakami et al. |
| 7,387,747 | B2 | 6/2008 | Taya et al. |
| 7,550,129 | B2 | 6/2009 | Baker et al. |
| 7,592,389 | B2 | 9/2009 | Baker et al. |
| 7,649,308 | B2 | 1/2010 | Lee et al. |
| 7,658,865 | B2 | 2/2010 | Lu |
| 7,674,410 | B2 | 3/2010 | Huang et al. |
| 7,784,531 | B1 | 8/2010 | Li et al. |
| 7,803,262 | B2 | 9/2010 | Haik et al. |
| 7,847,394 | B2 | 12/2010 | Dubin et al. |
| 7,863,366 | B2 | 1/2011 | Dupire et al. |
| 7,911,052 | B2 * | 3/2011 | Vadakkanmaruveedu et al. ............. 438/122 |
| 8,039,953 | B2 | 10/2011 | Dangelo |
| 8,048,794 | B2 | 11/2011 | Knickerbocker |
| 8,081,469 | B2 * | 12/2011 | Wang et al. .................. 438/122 |
| 8,106,510 | B2 | 1/2012 | Altman et al. |
| 8,937,385 | B2 * | 1/2015 | Ben Jamaa et al. ........... 438/122 |
| 2002/0054849 | A1 | 5/2002 | Baker et al. |
| 2004/0150100 | A1 | 8/2004 | Dubin et al. |
| 2005/0061496 | A1 | 3/2005 | Matbayas, Jr. |
| 2005/0239948 | A1 | 10/2005 | Haik et al. |
| 2005/0269726 | A1 | 12/2005 | Matabayas |
| 2006/0001013 | A1 | 1/2006 | Dupire et al. |
| 2006/0211327 | A1 | 9/2006 | Lee et al. |
| 2006/0286712 | A1 | 12/2006 | Brunschwiler et al. |
| 2007/0255002 | A1 | 11/2007 | Alba |
| 2008/0001283 | A1 | 1/2008 | Lee et al. |
| 2008/0042261 | A1 | 2/2008 | Wolter et al. |
| 2008/0080144 | A1 | 4/2008 | Machiroutu |
| 2009/0022977 | A1 | 1/2009 | Dudley et al. |
| 2009/0068387 | A1 | 3/2009 | Panzer et al. |
| 2009/0166021 | A1 | 7/2009 | Slaton et al. |
| 2009/0212418 | A1 * | 8/2009 | Gurrum et al. ................. 438/118 |
| 2009/0224422 | A1 | 9/2009 | Dubin |
| 2009/0236037 | A1 | 9/2009 | Fisher et al. |
| 2009/0247652 | A1 | 10/2009 | Silverman et al. |
| 2009/0269604 | A1 | 10/2009 | Wang et al. |
| 2009/0317660 | A1 | 12/2009 | Heintz et al. |
| 2010/0003530 | A1 | 1/2010 | Ganguli et al. |
| 2010/0224352 | A1 | 9/2010 | Stuckey et al. |
| 2010/0227155 | A1 | 9/2010 | Bao et al. |
| 2010/0301258 | A1 | 12/2010 | Chen et al. |
| 2011/0189500 | A1 | 8/2011 | Majumdar et al. |
| 2012/0018666 | A1 | 1/2012 | Kuczynski et al. |
| 2012/0292103 | A1 | 11/2012 | Dijon |
| 2013/0020716 | A1 * | 1/2013 | Kuczynski et al. ........... 257/774 |
| 2013/0127069 | A1 * | 5/2013 | Boday et al. .................. 257/777 |

FOREIGN PATENT DOCUMENTS

| | | |
|---|---|---|
| JP | 2007012911 A | 1/2007 |
| JP | 2009084746 A | 4/2009 |
| JP | 2009246258 A | 10/2009 |
| JP | 2010034254 A | 2/2010 |
| JP | 2010050259 A | 3/2010 |
| KR | 1020050107094 A | 11/2005 |
| KR | 1020070023212 A | 2/2007 |
| KR | 1020110037055 A | 4/2011 |
| WO | 2004090944 A2 | 10/2004 |
| WO | 2005031864 A1 | 4/2005 |
| WO | 2006044938 A2 | 4/2006 |
| WO | 2007089257 A2 | 8/2007 |
| WO | 2008112013 A1 | 9/2008 |
| WO | 2009075320 A1 | 6/2009 |

OTHER PUBLICATIONS

Fleischer et al., "Transient thermal management using phase change materials with embedded graphite nanofibers for systems with high power requirements," 11th Intersociety Conference on Thermal and Thermomechanical Phenomena in Electronic Systems, 2008. ITHERM 2008. May 28-31, 2008, pp. 561-566.

Ishioka et al., "Formation and Characteristics Vapor Grown Carbon Fibers Prepared in Linz-Donawitz Converter Gas," Carbon, vol. 30, No. 7, pp. 975-979. 1992.

Ishioka et al. "Formation of Vapor-Grown Carbon Fibers in CO—CO2—H2 Mixtures, I. Influence of Carrier Gas Composition," Carbon, vol. 30, No. 6, pp. 859-863, 1992.

Kopec et al., "Transient thermal performance of phase change materials with embedded graphite nanofibers," in "Thermes 2007: Thermal Challenges in Next Generation Systems," Garmella, S.V. and Fleischer, A.S., eds., Millpress, Rotterdam, The Netherlands, 2007, pp. 137-144.

Kuczynski et al. U.S. Appl. No. 12/842,200, "Method and System for Alignment of Graphite Nanofibers for Enhanced Thermal Interface Material Performance", filed Jul. 23, 2010.

Ruoff et al., "Mechanical and thermal properties of carbon nanotubes," Carbon, vol. 33, No. 7, pp. 925-930, 1995.

Tibbetts, Gary G., "Growing Carbon Fibers with a Linearly Increasing Temperature Sweep: Experiments and Modeling," Carbon, vol. 30, No. 3, pp. 399-406, 1992.

Weinstein et al., "The Experimental Exploration of Embedding Phase Change Materials with Graphite Nanofibers for the Thermal Management of Electronics," J. Heat Transfer, vol. 130, Issue 4. Apr. 2008. 8 pp.

Xie et al., "Dispersion and alignment of carbon nanotubes in polymer matrix: A review," Materials Science and Engineering: R: Reports, vol. 49, Issue 4, pp. 89-112, May 19, 2005.

Disclosed Anonymously, "Stretchable Thermal Interface Materials for Alignment of Graphitic Structures for Chipstack Cooling", IP.com Prior Art Database, IP.com No. IPCOM000213539D, Dec. 20, 2011.

Rodriguez et al., "Catalytic Engineering of Carbon Nanostructures", Langmuir 1995, pp. 3862-3866.

Kuczynski et al. U.S. Appl. No. 13/188,572, "System and Method to Process Horizontally Aligned Graphite Nanofibers in a Thermal Interface Material Used in 3D Chip Stacks", filed Jul. 22, 2011.

Tong, Tao et al., "Dense Vertically Aligned Multiwalled Carbon Nanotube Arrays as Thermal Interface Materials", IEEE Transactions on Components and Packaging Technologies, vol. 30, No. 1, Mar. 2007, pp. 92-100.

* cited by examiner

COMPOSITES COMPRISED OF ALIGNED CARBON FIBERS IN CHAIN-ALIGNED POLYMER BINDER

FIELD OF THE INVENTION

The present invention generally relates to thermal interface materials, and more particularly, to composites comprised of aligned carbon fibers in chain-aligned polymer binder.

BACKGROUND

Thermal interfaces in microelectronics packages are commonly credited with a majority of the resistance for heat to escape from the chip to an attached cooling device (e.g. heat sinks, spreaders and the like). Thus, in order to minimize the thermal resistance between the heat source and cooling device, a thermally conductive paste, thermal grease or adhesive is commonly used. Thermal interfaces are typically formed by pressing the heat sink or chip cap onto the backside of the processor chip with a particle filled viscous medium between, which is forced to flow into cavities or non-uniformities between the surfaces.

Thermal interface materials are typically composed of an organic matrix highly loaded with a thermally conductive filler. Thermal conductivity is driven primarily by the nature of the filler, which is randomly and homogeneously distributed throughout the organic matrix. Commonly used fillers exhibit isotropic thermal conductivity and thermal interface materials utilizing these fillers must be highly loaded to achieve the desired thermal conductivity. Unfortunately, these loading levels degrade the properties of the base matrix material (such as flow, cohesion, interfacial adhesion, etc.).

It has been determined that stacking layers of electronic circuitry (i.e. 3 dimensional chip stack) and vertically interconnecting the layers provides a significant increase in circuit density per unit area. However, one significant problem of the three dimensional chip stack is heat dissipation from the inner chips. For a four layer 3 dimensional chip stack, the surface area presented to the heat sink by the chip stack has only ¼ of the surface area presented by the two-dimensional approach. For a 4-layer chip stack, there are three layer-layer thermal interfaces in addition to the final layer to grease/heat sink interface. The heat from the bottom layers must be conducted up thru the higher layers to get to the grease/heat sink interface.

One approach utilizes nanotubes, such as for example carbon nanotubes (CNTs), to promote heat dissipation from the inner chips. However, the CNTs are randomly oriented in the thermal interface material (TIM). CNTs and other thermally conductive carbon structures exhibit anisotropic thermal conductivity such that the thermal conductivity is orders of magnitude greater along one axis. Random distribution of the CNTs does not maximize the thermal conductivity of the TIM. Recently, another approach has been disclosed for the alignment of carbon structures which allows for 3D chip stacks to have aligned CNTs or any form of carbon nanofibers (CNF), such as for example graphite nanofibers (GNFs), in the xy plane, such that heat may be brought to the edges of the stack. However, the viscosity of the TIM makes alignment difficult.

BRIEF SUMMARY

The exemplary embodiments of the present invention provide a method for enhancing internal layer-layer thermal interface performance and a device made from the method. In particular, disclosed is a method and system for aligning carbon nanofibers in a thermal interface material used in three dimensional chip stacks.

An exemplary embodiment includes a method for aligning a plurality of nanofibers in a thermal interface material to enhance the thermal interface material performance. The method includes adding at least one thermosetting polymer to the thermal interface material, dispersing the plurality of nanofibers into the thermal interface material, and un-crosslinking the at least one thermosetting polymer in the thermal interface material. The method further includes extruding the thermal interface material through a die to orient the conductive axis of the nanofibers in the desired direction, and re-crosslinking the at least one thermosetting polymer in the thermal interface material.

Another exemplary embodiment includes a chip stack of semiconductor chips with enhanced cooling apparatus. Briefly described in terms of architecture, one embodiment of the apparatus, among others, is implemented as follows. The chip stack of semiconductor chips with enhanced cooling apparatus includes a first chip with circuitry on a first side and a second chip electrically and mechanically coupled to the first chip by a grid of connectors. The chip stack further includes a thermal interface material pad between the first chip and the second chip. The thermal interface material pad comprises a plurality of nanofibers, aligned parallel to mating surfaces of the first chip and the second chip, and a thermosetting polymer that will un-crosslink and reduce viscosity of the thermal interface material to allow for extruding the thermal interface material through a die to orient the conductive axis of the nanofibers in the desired direction.

Another exemplary embodiment includes a system for aligning a plurality of nanofibers in a thermal interface material to enhance the thermal interface material performance. Briefly described in terms of architecture, one embodiment of the system, among others, is implemented as follows. The system includes a means for adding at least one thermosetting polymer to the thermal interface material, a means for dispersing the plurality of nanofibers into the thermal interface material, and a means for un-crosslinking the at least one thermosetting polymer in the thermal interface material. The system further includes a means for extruding the thermal interface material through a die to orient the conductive axis of the nanofibers in the desired direction; and a means for re-crosslinking the at least one thermosetting polymer in the thermal interface material.

These and other aspects, features and advantages of the invention will be understood with reference to the drawing figures and detailed description herein, and will be realized by means of the various elements and combinations particularly pointed out in the appended claims. It is to be understood that both the foregoing general description and the following brief description of the drawing and detailed description of the invention are exemplary and explanatory of preferred embodiments of the invention, and are not restrictive of the invention, as claimed.

BRIEF DESCRIPTION OF THE SEVERAL VIEWS OF THE DRAWINGS

The subject matter, which is regarded as the invention, is particularly pointed out and distinctly claimed in the claims at the conclusion of the specification. The foregoing and other objects, features, and advantages of the invention are apparent from the following detailed description taken in conjunction with the accompanying drawings in which:

Figure 1:
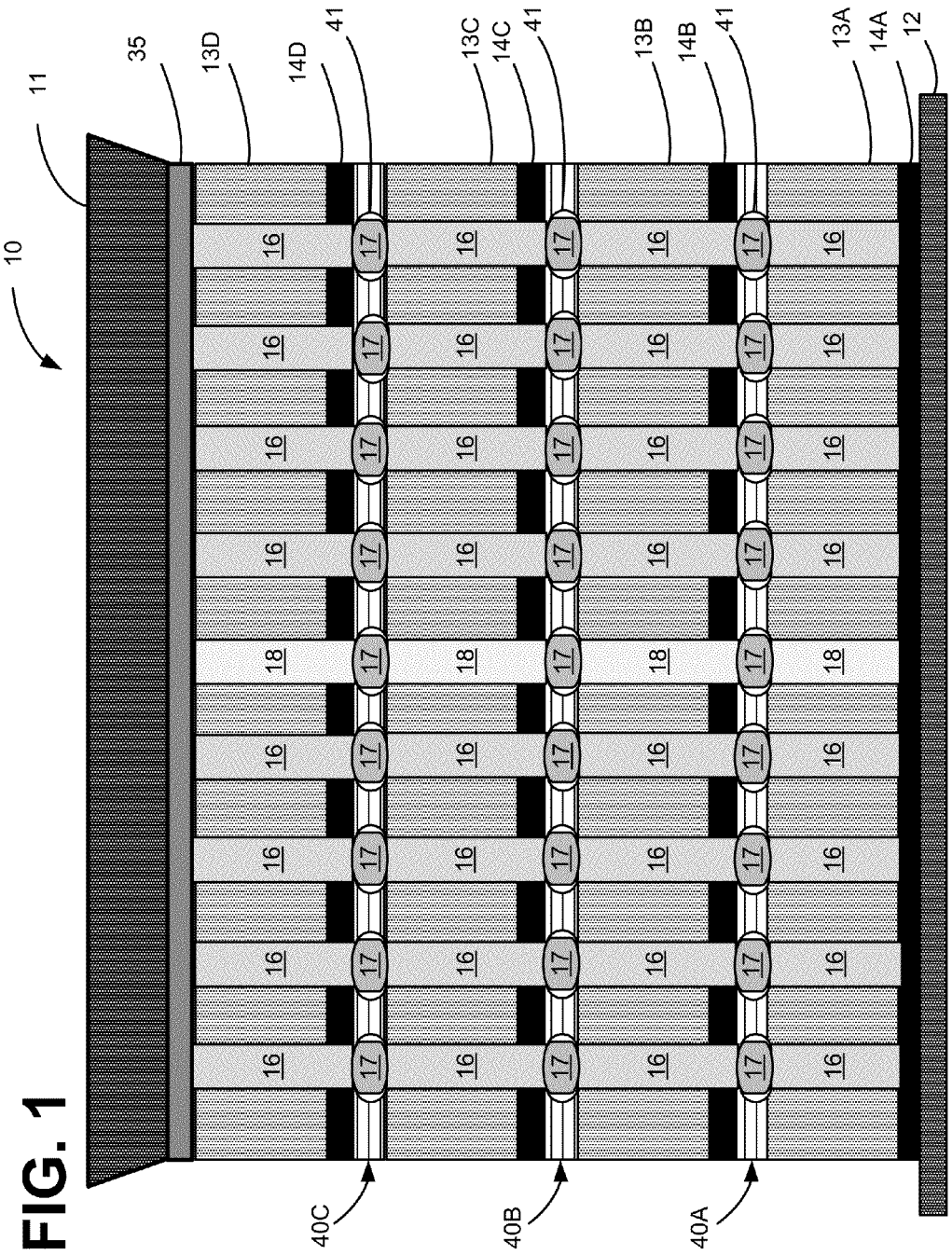
FIG. 1 is a cross section block diagram illustrating an example of the C4 or flip chip connection channels in a silicon device stack utilizing the thermal interface material with nanofibers aligned along the conductive axis in the desired direction of the present invention.

The detailed description explains the preferred embodiments of the invention, together with advantages and features, by way of example with reference to the drawings.

DETAILED DESCRIPTION

The present invention may be understood more readily by reference to the following detailed description of the invention taken in connection with the accompanying drawing figures, which form a part of this disclosure. It is to be understood that this invention is not limited to the specific devices, methods, conditions or parameters described and/or shown herein, and that the terminology used herein is for the purpose of describing particular embodiments by way of example only and is not intended to be limiting of the claimed invention.

One or more exemplary embodiments of the invention are described below in detail. The disclosed embodiments are intended to be illustrative only since numerous modifications and variations therein will be apparent to those of ordinary skill in the art.

One or more exemplary embodiments of the invention disclose a thermal interface material formulation, which allows for nanofibers to be aligned once a trigger renders a gel like thermal interface material (TIM) into a lower viscosity material allowing for a more facile method of alignment. Once alignment is accomplished, the thermal interface material converts back to a solid gel. This can be accomplished via the use of reversible Diels-Alder chemistry and reversible phenol and isocyanate chemistry.

One or more exemplary embodiments of the invention are directed to providing a thermal interface material that is placed between chips in a chip stack. The thermal interface material having nanofibers/nanotubes, aligned to efficiently transfer heat to at least two sides (e.g., east and west, or north and south) of a chip stack. The thermal interface material base is created by mixing at least one polymer for a thermal interface material base. The nanofibers/nanotubes are mixed into the thermal interface material and are allowed to cure. The thermal interface material is then treated to un-crosslink the least one polymer in the thermal interface material. In the preferred embodiment, heat is applied to un-crosslink the least one polymer in the thermal interface material. In an alternative embodiment, a solvent or reactive chemical is applied to the thermal interface material to un-crosslink the least one polymer in the thermal interface material. In still another alternative embodiment, a disulfide crosslinked epoxy can be used. The disulfide bond can be reduced using phosphines and then oxidized to reform the disulfide bond. Each example embodiment renders the gel like TIM material into a lower viscosity material allowing for a more facile method of alignment. Next, the nanofibers/nanotubes are aligned within the lower viscosity thermal interface material by being extruded through a tool die. The material is then cooled, sliced into pads and placed between layers of chips in the chip stack.

In one embodiment, all nanofibers/nanotubes are aligned "east/west" and draw the heat to heat sinks (i.e. heat dissapating objects) on the east and west sides of the chip stack. In another embodiment, the pads are alternated among chips so that alternating layers draw heat to heat sinks on the east/west sides of the chip stack and to the north/south side of the chip stack. In still another embodiment, pieces of the pads are arranged such that two opposite sides of the arrangement conduct heat east/west and another two opposite sides conduct heat north/south. In this embodiment, the nanofibers/nanotubes are arranged so that both ends are perpendicular to the closest edge of the pad.

A thermal interface material is used to fill the gaps between thermal transfer surfaces, such as between microprocessors and heat sinks, in order to increase thermal transfer efficiency. These gaps are normally filled with air, which is a very poor conductor. A thermal interface material may take on many forms. The most common is the white-colored paste or thermal grease, typically silicone oil filled with aluminum oxide, zinc oxide, or boron nitride. Some brands of thermal interface materials use micronized or pulverized silver. Another type of thermal interface materials are the phase-change materials. The phase change materials are solid at room temperature, but liquefy and behave like grease at operating temperatures.

A phase change material is a substance with a high heat of fusion which, melting and solidifying at a certain temperature, is capable of storing and releasing large amounts of energy. Heat is absorbed or released when the material changes from solid to liquid and vice versa; thus, phase change materials are classified as latent heat storage units.

Phase change materials latent heat storage can be achieved through solid-solid, solid-liquid, solid-gas and liquid-gas phase change. However, the only phase change used for thermal interface materials is the solid-liquid change. Liquid-gas phase changes are not practical for use as thermal storage due to the large volumes or high pressures required to store the materials when in their gas phase. Liquid-gas transitions do have a higher heat of transformation than solid-liquid transitions. Solid-solid phase changes are typically very slow and have a rather low heat of transformation.

Initially, the solid-liquid phase change materials behave like sensible heat storage materials; their temperature rises as they absorb heat. Unlike conventional sensible heat storage, however, when phase change materials reach the temperature at which they change phase (i.e. melting temperature) they absorb large amounts of heat at an almost constant temperature. The phase change material continues to absorb heat without a significant rise in temperature until all the material is transformed to the liquid phase. When the ambient temperature around a liquid material falls, the phase change material solidifies, releasing its stored latent heat. A large number of phase change materials are available in any required temperature range from −5 up to 190° C. Within the human comfort range of 20° to 30° C., some phase change materials are very effective. They can store 5 to 14 times more heat per unit volume than conventional storage materials such as water, masonry, or rock.

It is well known that the incorporation of certain types of carbon nanofibers into thermal interface material can impart thermal conductivity to such materials. Carbon nanofibers or carbon nanotubes, can be dispersed in thermal interface material by various well-known techniques. These techniques include, but are not limited to, melting, kneading and dispersive mixers to form an admixture that can be subsequently shaped to form a thermally conductive article.

Nanofibers are defined as fibers with diameters on the order of 100 nanometers. They can be produced by interfacial polymerization and electrospinning. In one embodiment, carbon nanofibers are graphitized fibers produced by catalytic synthesis around a catalytic core. The catalytic core around which graphite platelets are formed is, for exemplary purposes, called a metal seed or a catalytic metal seed, wherein the catalytic metal seed is a material having magnetic properties such as iron, cobalt, or nickel. Other non-metal materials suitable for forming both polymer chain and graphite fiber alignment in the direction of high strain are within the scope of the invention.

Carbon nanofibers can be grown in numerous shapes around a catalytic seed. From the physical point of view, carbon nanofibers vary from 5 to 100 microns in length and are between 5 to 100 nm in diameter. In one embodiment, the carbon nanofibers comprised of graphite platelets are arranged in various orientations with respect to the long axis of the fiber, giving rise to assorted conformations.

Carbon nanotubes (CNTs) are allotropes of carbon with a cylindrical nanostructure. Nanotubes have been constructed with a length-to-diameter ratio of up to 132,000,000:1, significantly larger than any other material. They exhibit extraordinary strength and unique electrical properties, and are efficient thermal conductors. Nanotubes are members of the fullerene structural family, which also includes the spherical buckyballs. The ends of a nanotube may be capped with a hemisphere of the buckyball structure. Their name is derived from their size, since the diameter of a nanotube is on the order of a few nanometers (approximately 1/50,000th of the width of a human hair), while they can be up to 18 centimeters in length.

Carbon nanofibers and nanotubes have received considerable attention in the electronics field due to their remarkable thermal conductivity. Moreover, the thermal conductivity of carbon nanofibers and nanotubes are anisotropic. Anisotropy is the property of being directionally dependent, as opposed to isotropy, which implies homogeneity in all directions. Therefore, the present invention takes advantage of the anisotropic nature of the carbon nanofibers and nanotubes by effectively aligning them along the conductive axis, thereby generating a thermal interface material with exceptional thermal conductivity at comparatively low loading levels. Diamond, graphite, and graphite fibers have been known as excellent heat conductors with a high thermal conductivity up to 3000 W/m-K.

Currently in known thermal interface materials, the polymeric matrix when the alignment would occur is very viscous. This makes alignment difficult. In one embodiment of the present invention is a TIM formulation that allows for carbon fiber like structures to be aligned once a thermal trigger is reached which renders the gel like TIM material into a lower viscosity material. This allows for a more facile method of alignment. Once alignment is accomplished, the temperature is reduced and the TIM converts back to a solid gel. This can be accomplished via the use of reversible Diels-Alder chemistry, reversible phenol and isocyanate chemistry or the like.

Referring now to the drawings, in which like numerals illustrate like elements throughout the several views. FIG. 1 is a cross section block diagram illustrating an example of a controlled collapse chip connection (i.e. C4) or flip chip electrically conductive channels 16 and thermal conductive channels 18 utilized in a chip stack 10.

The chip stack 10 comprises a multitude of chips 13 (A-D) that further include one or more electrically conductive channels 16 and/or thermal conductive channels 18, which extend through a chip 13 from the top surface to the bottom surface. In one embodiment, the "conductive channel" is really a combination of two or more thru-silicon-vias (TSVs) connected sequentially by one or more controlled collapse chip connection (C4s).

Preferably, the electrically conductive channels 16 are formed of tungsten or copper; however, other conductive materials may be used and are contemplated. The electrically conductive channels 16 selectively conduct electrical signals to and from portions of the circuitry 14 thereon or simply couple to solder bumps 17 to interconnect differing chips 13 in the chip stack 10 (e.g., chips 13A and 13B), or both. The solder bumps 17 are located within an area 41 of a thermal interface material (TIM) pad 40. In one embodiment, the area 41 is punched out of the TIM pad 40. In another embodiment, the area 41 is formed during the creation of the TIM pad 40.

The TIM pad 40 comprises carbon nanotubes (CNTs), carbon nanofibers (CNF), graphitic nanofibers (GNFs) or the like, that are dispersed in a phase change material (PCM) or a silicone grease. After the PCM viscosity has been lowered either through heat or a solvent, the CNTs, CNFs or GNFs are then aligned in the xy plane (i.e. positioned parallel to the surface of the chip 13). This is so that heat may be brought to the edges of the chip stack 10. Once the heat is brought to the edges of the chip stack 10, multiple heat sinks 11 or other type devices may be utilized to more efficiently dissipate that heat of the chip stack 10.

In one embodiment, CNTs, CNFs or GNFs are aligned in the thermal interface material 30 in one direction by extruding the thermal interface material containing nanofibers or nanotubes through a tooled die. By aligning the CNTs, CNFs or GNFs along the conductive axis in the xy plane of the 3D chip stack 10 creates a TIM pad 40 with exceptional thermal conductivity at comparatively low loading levels. The system and method for aligning graphic nanofibers to enhance thermal interface material performance are described in commonly assigned and co-pending U.S. patent application (Attorney Docket ROC920100010US1) entitled "A METHOD AND SYSTEM FOR ALLIGNMENT OF CARBON NANOFIBERS FOR ENHANCED THERMAL INTERFACE MATERIAL PERFORMANCE", Ser. No. 12/842,200 filed on, Jul. 23, 2010, and U.S. patent application (Attorney Docket ROC9201100670US1) entitled "A System and Method to Process Horizontally Aligned Graphite Nanofibers in a Thermal Interface Material Used in 3D Chip Stacks", Ser. No. 13/188,572 filed on, Jul. 22, 2011, both herein incorporated by reference.

Preferably, the thermal conductive channels 18 are formed and filled with conductive materials, metal or alternatively are formed of thermal grease. The thermal grease is typically silicone oil filled with aluminum oxide, zinc oxide, or boron nitride; however, other conductive materials may be used and are contemplated. Some brands of thermal conductive channels 18 use micronized or pulverized silver. Another type of thermal conductive channels 18 are the phase-change materials. The phase change materials are solid at room temperature, but liquefy and behave like grease at operating temperatures. The thermal conductive channels 18 conduct heat to and from portions of the circuitry 14 thereon. The thermal conductive channels 18 couple to solder bumps 17 to interconnect differing chips 13 in the chip stack 10 (e.g., chips 13A and 13B), couple to heat sink 11 through TIM block 35 or TIM pad 40 of the present invention, that conducts the heat to the side of the chip stack 10.

The electrically conductive channels 16 couple to solder bumps 17 on a bond pad (not shown) on the bottom surface of chip 13 (A-C). The solder bumps 17 are electrically isolated from the chip 13 and one another according to conventional practice. In addition, the electrically conductive channels 16 are preferably electrically insulated from the chip 13 by insulating regions (not shown) which are disposed between the electrically conductive channels 16 and the chip 13. The insulating regions preferably are silicon dioxide ($SiO_2$); however, other insulating materials may be employed and are contemplated as falling within the scope of the present invention. The insulating regions prevent the signals being transmitted in the electrically conductive channels 16 from disturbing the bias voltage of the chip 13 (which is typically either a ground potential or a Vdd). Of course, in some cases, one of the terminals of the circuitry 14 on the top surface may be held at a substrate potential, in which case, the appropriate electrically conductive channel 16 may be non-insulated and thus be in electrical contact with the chip 13 being held at a similar potential, as may be desired.

As shown, each chip 13 uses electrically conductive channels 16 in a controlled, collapse chip connection (C4) structure (also often called solder bump or flip-chip bonding). The chip stack 10 includes a base chip 13A electrically connected to substrate 12. The chip stack 10 includes a circuit board or substrate 12 that is connected to a base chip 13A. Solder bumps 17 are then placed on a bond pad (not shown) for the electrically conductive channels 16 of a second (or top) chip 13A, which is oriented facedown (i.e., flip-chip), aligned and brought into contact with the electrically conductive channels 16. Electrical interconnections between the electrically conductive channels 16 are formed by heating the solder bumps 17 to a reflow temperature, at which point the solder flows. After the solder flows, subsequent cooling results in a fixed, electrically conductive joint to be formed between the electrically conductive channels 16.

The top chip 13D on one side is attached to a heat sink 11 with a thermal interface material. In one embodiment, a thermal interface material incorporating vertically aligned carbon (graphite) nanofibers can be utilized as a very effective thermal interface material between a top of chip 13D and a heat sink 11. Such an arrangement is disclosed in U.S. patent application (entitled "A METHOD AND SYSTEM FOR ALLIGNMENT OF CARBON NANOFIBERS FOR ENHANCED THERMAL INTERFACE MATERIAL PERFORMANCE", Ser. No. 12/842,200. Other chips 13A-13C can have C4 connection structures implemented on both the top surface and bottom surface thereof, as illustrated in FIG. 1. In such instances, a second chip 13B may similarly be oriented facedown with respect to the base chip 13A and coupled thereto-using solder bumps 17.

The C4 structure of FIG. 1 overcomes one disadvantage of the connection methodologies. Initially, because the ball-bonding attachment technique is avoided, significantly less stress is placed on the solder bump 17 during connection, which allows circuitry 14 (A-C) to be formed under the solder bump 17. The circuitry 14 (A-D) is formed according to any one of many conventional semiconductor processing techniques. However, the C4 structure of FIG. 1 has one major disadvantage of not being able to dissipate the heat generated by circuitry 14 (A-D). The TIM pad 40 of the present invention, comprises carbon nanotubes (CNTs), carbon nanofibers (CNFs) or graphic nanofibers (GNFs) that are dispersed in a phase change material (PCM) or a silicone grease. The CNTs, CNFs or GNFs are aligned in the position parallel to the surface of the chip 13. This is so that heat may be brought to the edges of the chip stack 10. Once the heat is brought to the edges of the chip stack 10, multiple heat sinks or other type devices may be utilized to more efficiently dissipate that heat of the chip stack 10. In one embodiment, all carbon nanofibers/nanotubes are aligned "east/west" and draw the heat to heat sinks on the east and west sides of the chip stack. In another embodiment, all carbon nanofibers/nanotubes are aligned "north/south" and draw the heat to heat sinks on the north and south sides of the chip stack. In still another embodiment, some carbon nanofibers/nanotubes are aligned are aligned "east/west" and "north/south" and draw the heat to heat sinks on the nearest sides of the chip stack.

Figure 2A:
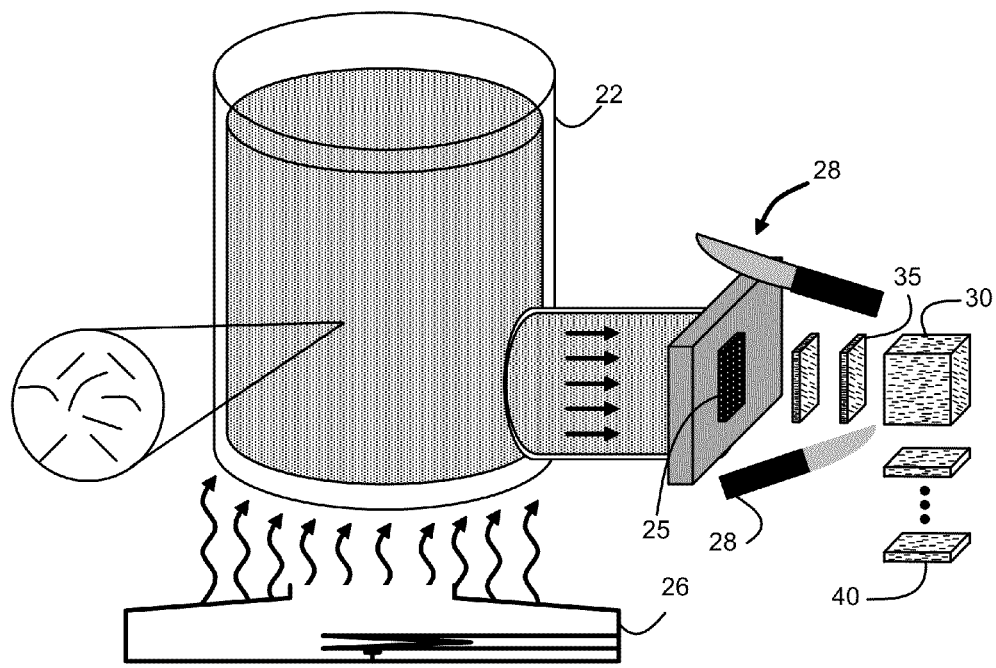
FIG. 2A is a block diagram illustrating an example of the thermal interface material with nanofibers brought to an elevated temperature, leading to an uncross-linking reaction of the thermal interface material then aligned to orient the conductive axis in the desired direction in the thermal interface material.

FIG. 2A is a block diagram illustrating an example of the carbon nanofibers 31, randomly dispersed in the thermal interface material 30. The carbon nanofibers 31 are disbursed into the melted thermal interface material 30 using well-established methods. In one embodiment, a high-speed dispersive mixer can be utilized. The carbon nanofibers 31 typically are dispersed essentially homogeneously throughout the bulk of the thermal interface material 30. As shown there is thermal interface material 30 in a crucible 22. The crucible 22 is heated to a temperature so that the thermal interface material 30 melts. The heat is supplied by using well-established heating apparatuses 26. In one embodiment, the thermal interface material 30 is melted at a temperature 10C-20C above the thermal interface material 30 melting temperature. the reduced viscosity thermal interface material 30 with carbon nanofibers 31, brought to an elevated temperature, leading to an uncross-linking reaction of the thermal interface material 30. The uncross-linking reaction vastly reduces the viscosity of the thermal interface material 30 as compared to typical PCMs.

The crucible 22 is cooled to approximately near the melting point of the thermal interface material 30. In one embodiment, the thermal interface material 30 can be, but is not limited to, paraffins ($C_nH_{2n+2}$); fatty acids ($CH_3(CH_2)_{2n}COOH$); metal salt hydrates ($M_nH_2O$); and eutectics (which tend to be solutions of salts in water). In still another embodiment, the thermal interface material 30 can be silicone-based gels or pastes that are eventually cured into pads. In the preferred embodiment, the thermal interface material 30 includes a chain-aligned polymer binder. This is in contrast to other conventional TIMs which use polymers whose chains are randomly oriented and thus possess a much lower thermal conductivity, thereby reducing the overall thermal transport performance of their respective composites. Applicable polymers include but are not limited to "green" bio-derived polyethylene, fossil-derived polyethylene, and polybenzobisoxazole.

The carbon nanofibers 31 are then aligned to orient the conductive axis in the desired direction in the thermal interface material 30. In the preferred embodiment, the thermal interface material 30 with the carbon nanofibers 31 are aligned by being extruded through tooled die 25 with desired product cross-section. The extrusion aligns fibers and polymer chains in extrusion direction. This enhances heat conductivity along the aligned long chains carbon nanofibers 31. Next, any additional strain-aligning is performed as necessary.

Figure 3A:
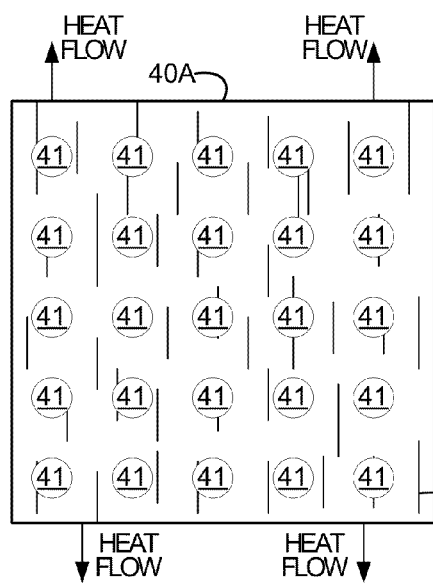
FIGS. 3A and 3B are block diagrams illustrating an example of a top view of the TIM pad with carbon nanofibers aligned by extruding the TIM through a die to orient the conductive axis in perpendicular directions to the TIM pad
Figure 3B:
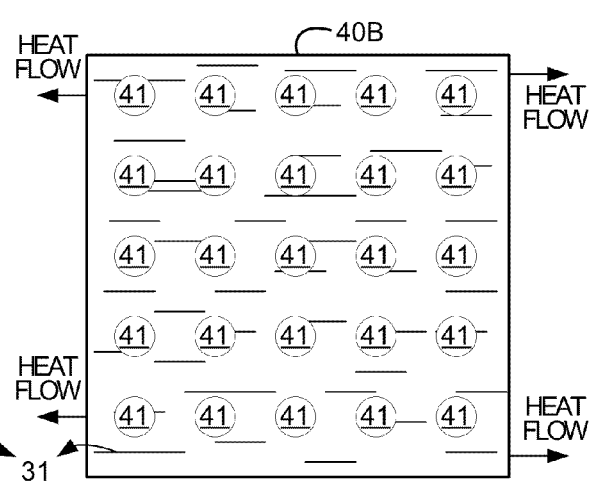
Figure 3C:
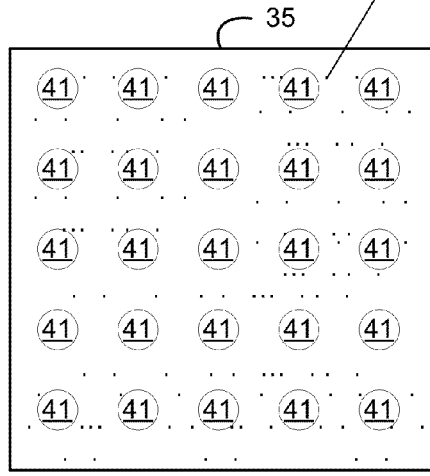
FIG. 3C is a block diagram illustrating a top view example of the TIM block with carbon nanofibers oriented with the conductive axis in parallel with the solder bumps and areas on the TIM block.
Figure 4:
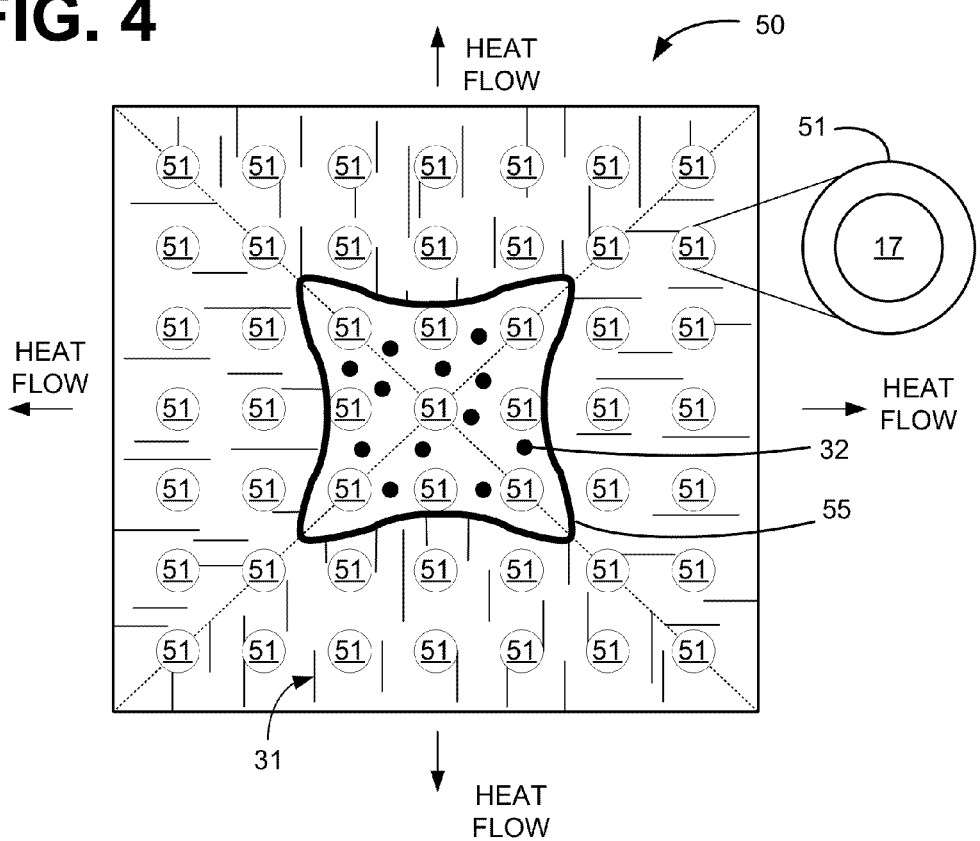
FIG. 4 is a block diagram illustrating an example of the thermal interface material with nanofibers arranged such that two opposite sides of the thermal interface material with nanofibers are aligned to conduct heat in the east/west direction and another two opposite sides conduct heat in the north/south direction.

The carbon nanofibers 31 can be aligned in the xy plane. In one embodiment, the long axis of the carbon nanofibers 31 are aligned in an orientation parallel to the mating surfaces. This is illustrated in FIGS. 3A and 3B. In another embodiment, the carbon nanofibers 31 are aligned in an orientation perpendicular to the mating surfaces as illustrated in FIG. 3C. In still another embodiment, the carbon nanofibers 31 are aligned in an orientation parallel to the mating surfaces, such that two opposite sides of the thermal interface material 30 have carbon nanofibers 31 aligned in one direction parallel with the sides of the thermal interface material 30 and other carbon nanofibers 31 on opposite sides aligned in a second direction perpendicular to the first direction and still parallel with the mating surfaces. This is illustrated in FIG. 4.

Figure 2B:
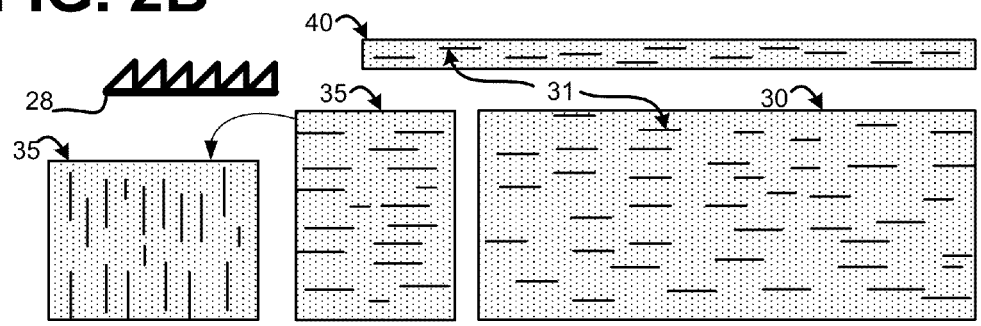
FIG. 2B is a block diagram illustrating an example of the slicing the thermal interface material into the desired footprint.

The TIM pads 40 are then cut to the desired footprint from the thermal interface material 30. This is illustrated in FIG. 2B.

According to the present disclosure, the thermal conductivity at desired locations is increased by TIM pad 40 with aligned carbon nanofibers 31 between the multiple chips 13A-D. By utilizing the TIM pad 40 with aligned carbon nanofibers 31 between multiple chips 13A-D, more heat transfer to the edge of the chip stack 10 can be achieved. The advantage of this solution is that it further reduces chip temperatures through no modification to the chip surface and does not require changes to the manufacturing line or the addition of more components to the system such as liquid coolants and microchannel heat exchangers.

In one embodiment, heat from well-established heating apparatuses 26 is applied to un-crosslink the least one polymer in the thermal interface material 30. In an alternative embodiment, a solvent or reactive chemical is applied to the thermal interface material 30 to un-crosslink the least one polymer in the thermal interface material. In still another alternative embodiment, a disulfide crosslinked epoxy can be used. The disulfide bond can be reduced using phosphines and then oxidized to reform the disulfide bond. Each example embodiment renders the gel like TIM material into a lower viscosity material allowing for a more facile method of alignment.

Following the uncross-linking reaction, the viscosity of the thermal interface material 30 decreases to approximately 170-400 cSt whereas the viscosity of typical phase change materials is at least several orders of magnitude greater than the reactants as crosslinks within the gel build structure in the TIM pads 40. For reference, the viscosity of water @ 20 C. is 1.0 cSt or cP because the density is 1.0, and the viscosity of typical non-curing Phase change materials @ 20 C. is generally in the range of 100K-500K cSt. However, typical Phase change materials will also undergo a dramatic change in viscosity above the melt temperature, however, some Phase change materials are designed NOT to do so. The reason behind this is to prevent pumping of the liquid PHASE CHANGE MATERIAL as the assembly thermally cycles. By limiting the viscosity of Phase change materials in the liquid state, this pumping of the liquid PHASE CHANGE MATERIAL can be avoided. However, by doing so, it becomes much more problematic to mix and align the carbon nanofibers 31 in the liquid phase of the liquid Phase change materials. The thermal interface material 30 of the present invention overcomes these limitations by having a very low viscosity fluid to begin with that enables easy CNF/CNT alignment when uncross-linked and then when cross-linked into a gel, it will not pump out.

FIG. 2B is a block diagram illustrating an example of the slicing of the thermal interface material 30 into the desired footprint or TIM pad 40 and block 35. TIM pads 40 of appropriately sized geometry (length X and width Y) are cut from the slab of thermal interface material 30 using conventional techniques of dicing apparatus 28 known to those skilled in the art. The geometry of TIM pads 30, 35 and 40, are dictated by the footprint of the integrated circuitry on chips 13(A-D) to which the TIM pads 35 and 40, will be mated. Blocks 35 of appropriately sized geometry (length X and width Y) are cut from the slab of thermal interface material 30 using conventional techniques of dicing apparatus 28 known to those skilled in the art. The block 35 is rotated so that the carbon nanofibers 31 are vertically aligned.

FIGS. 3A and 3B are block diagrams illustrating an example of a top view of the TIM pad 40 with carbon nanofibers 31 aligned by extruding the TIM 30 through a die 25 to orient the conductive axis in perpendicular directions to the TIM pad 40. The solder bumps 17 are formed on conductive channels 16, on the chip 13. The solder bumps 17 rest on areas 41 to connect one chip to another chip through TIM pad 40 to electrically conductive signals from, for example, chip 13A to another chip 13B. In another embodiment, the solder bumps 17 can conduct heat from, for example, chip 13A to another chip 13B and eventually to heat sink 11. In another embodiment, the solder bumps 17 can conduct heat laterally from the solder bumps 17 through TIM pad 40(A-C) and between two chips 13(A-D) to the edges of the chip stack 10. In still another embodiment, the direction of the carbon nanofibers 31 in TIM pads 50 are alternated among chips so that alternating layers draw heat to heat sinks on the east/west sides of the chip stack and to the north/south side of the chip stack.

As shown, the plurality of solder bumps 17 and areas 41 are circular, however, this is for illustration only and the solder bumps 17 and areas 41 may be of any shape including, but not limited to, triangular, rectangular, square, circular, elliptical, irregular or any four or more sided shape. The size and shape of areas 41 are generally determined by the size and shape of solder bump 17. This is in order to provide a space in the TIM pad 40 for the solder bumps 17.

Also as shown, the solder bumps 17 and areas 41 in one embodiment are laid out in regular patterns, however, this is for illustration only and the solder bumps 17 and areas 41 have the flexibility to be laid out in any desired pattern. This additional level of flexibility allows the circuitry on chips 13(A-D) to be laid out without regard to the solder bumps 17 and areas 41 locations. This further allows the solder bump 17 locations above the circuitry on chips 13(A-D) to be located in an optimized fashion, to directly couple with circuitry 14 on another chip 13. In another embodiment, the solder bumps 17 and areas 41 may be formed in a pattern where the conductive channels 16 provide power at the periphery of the chip 13 to aid in cooling the chip 13. Therefore, the solder bumps 17 and areas 41 may be located anywhere on the chip 13A-D as illustrated in FIG. 1, without the need to form such interconnections on peripheral edges of the die. The solder bumps 17 are located within an area 41 (FIG. 3(A-C)) of a thermal interface material (TIM) pad 40. In one embodiment, the area 41 is punched out of the TIM pad 40. In another embodiment, the area 41 is formed during the creation of the TIM pad 40. A TIM pad 40 is used to remove any gaps between thermal transfer surfaces, such as between chips 13 (A-D), microprocessors and heat sinks 11, in order to increase thermal transfer efficiency. Any gaps are normally filled with air, which is a very poor conductor.

FIG. 3C is a block diagram illustrating a top view example of the TIM block 35 with carbon nanofibers 31 oriented with the conductive axis in parallel with the solder bumps 17 and areas 41 on the TIM block 35. There are a plurality of areas 41 formed at various locations thereon. These areas 41 are for the solder bumps 17 to connect chips 13(A-D) together. In an alternative embodiment, a second TIM block 35 is in thermal contact with the center of TIM blocks 35 between chips 13(A-D) to effectively draw heat to a chip above and below to ultimately connect to heat sink 11 on a top of the chip stack 10. In another alternative embodiment, the additional TIM blocks 35 are in thermal contact with edges of TIM pads 40 hanging out between chips 13(A-D) to effectively draw heat to a heat sink 11 on the sides of the chip stack 10.

Figure 3D:
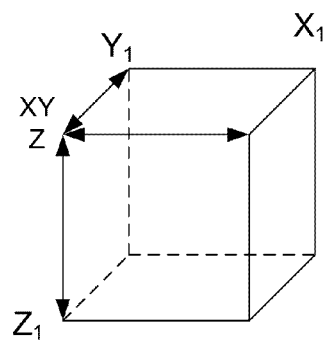
FIG. 3D is a block diagram illustrating an example of the vectors in which the carbon nanofibers are aligned. In this illustration, the nanofibers are either horizontally (i.e. XWY plane) or vertically (i.e. XWZ plane) aligned through the chip stack using carbon nanofibers, as shown in FIGS. 3A-3C.

FIG. 3D is a block diagram illustrating an example of the vectors in which the carbon nanofibers 31 are aligned. In this illustration, the nanofibers 31 are either horizontally (i.e. XWY plane) or vertically (i.e. XWZ plane) aligned through the chip stack using carbon nanofibers 31, as shown in FIGS. 3A-3C. The vertical nanofibers 31 (i.e. XWZ plane) are in a plane perpendicular to the horizontal nanofibers 31 (i.e. XWY plane). In order to differentiate the nanofibers 31 oriented in the horizontal plane (i.e. XWY plane) from the nanofibers 31 oriented in the vertical plane (i.e. XWZ plane), from now on those fibers oriented in the vertical plane (i.e. XWZ plane) will be referred to as nanofibers 32. This means that the carbon nanofibers 31 are always aligned in the horizontal plane (i.e. XWY plane) perpendicular to the closest side edge (i.e. not top or bottom) of TIM pad 40. Whereas, nanofibers 32 on block 35 are aligned in the vertical plane (i.e. XWZ plane) and always perpendicular to all carbon nanofibers 31.

FIG. 4 is a block diagram illustrating a top down view example of the TIM pad 50 with carbon nanofibers 31 arranged such that two opposite sides of the TIM pad 50 with carbon nanofibers 31 conduct heat in one direction parallel with the sides of the TIM pad 50 in contact with chip 13 and another two on opposite sides conduct heat in a second direction perpendicular to the first direction and still parallel with the sides of the TIM pad 50 in contact with chip 13. The illustrated example also shows the TIM pad 50 with a vertical heat transmission block 55 (i.e. thermal channel) that includes nanofibers 32 that are perpendicular to all carbon nanofibers 31 in the TIM pad 50. In this embodiment, the bi-directional TIM pad 50 displayed in the top down view illustrated in FIGS. 3A and 3B can be easily sectioned and connected together to conduct heat to all four sides of the chip stack using carbon nanofibers 31, and vertically through the vertical heat transmission block 55 using nanofibers 32, as shown. The vertical heat transmission block 55 is formed (i.e. cut) from TIM block 30 illustrated in FIGS. 2(A and B). This means that the carbon nanofibers 31 are always aligned in the horizontal plane (i.e. XWY and VZU plane) perpendicular to the closest edge of TIM pad 50. Whereas the nanofibers 32 on vertical heat transmission block 55 are aligned in the vertical plane (i.e. YWZ plane) and always perpendicular to all carbon nanofibers 31. In this embodiment, the pattern areas for the chip solder bumps 17 on TIM pad 50 are generally applied after assembling the TIM pad 50. This is to ensure that the area for the chip solder bumps 17 on chips 13(A-D) are properly aligned. The solder bumps 17 are located within an area 51 of a thermal interface material (TIM) pad 50. In one embodiment, the area 51 is punched out of the TIM pad 50. In another embodiment, the area 51 is formed during the creation of the TIM pad 50.

Figure 5:
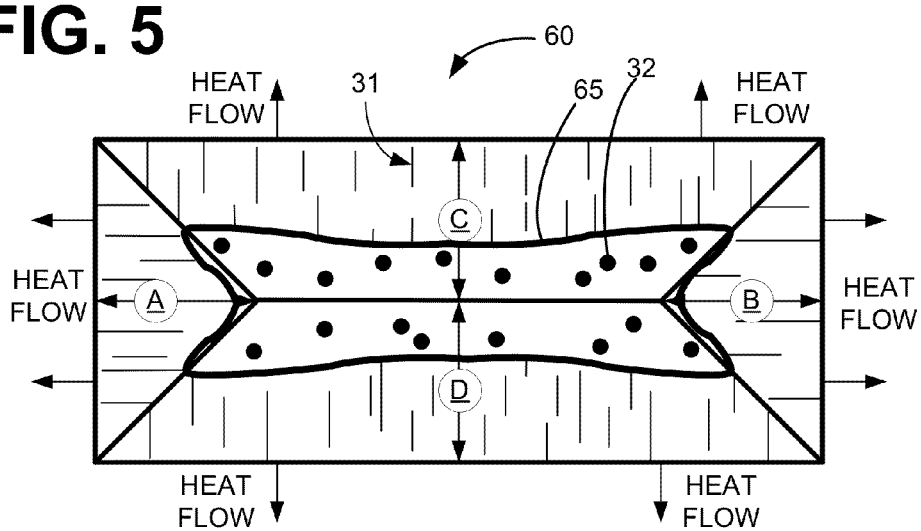
FIG. 5 is a block diagram illustrating another example of the thermal interface material with nanofibers arranged such that two opposite sides of the thermal interface material with nanofibers are aligned to conduct heat in the east/west direction and another two opposite sides conduct heat in the north/south direction.

FIG. 5 is a block diagram illustrating another example of the TIM pad 60 with carbon nanofibers 31 arranged such that two opposite sides of the TIM pad 60 with carbon nanofibers 31 conduct heat in one direction parallel with the sides of the TIM pad 60 in contact with chip 13 and another two on opposite sides conduct heat in a second direction perpendicular to the first direction and still parallel with the sides of the TIM pad 60 in contact with chip 13. The illustrated example also shows the TIM pad 60 with a vertical heat transmission block 65 (i.e. channel) that includes nanofibers 32 that are perpendicular to all carbon nanofibers 31 in the TIM pad 60. In this embodiment, the bi-directional TIM pad 60 displayed in the top down view illustrated in FIGS. 3A and 3B can be easily sectioned and connected together to conduct heat to all four sides of the chip stack using carbon nanofibers 31 and vertically through the vertical heat transmission block 65 illustrated in FIG. 3C using nanofibers 32, as shown. This means that the carbon nanofibers 31 are always aligned in the XY plane perpendicular to the closest edge of TIM pad 60. Whereas the nanofibers 32 on block 65 are aligned in the ZWX or WZU plane and always perpendicular to all carbon nanofibers 31. In this alternative embodiment, the bi-directional TIM pad 60 displayed in a top down view illustrated in FIGS. 3A and 3B can be easily sectioned and connected together to conduct heat to all four sides of the chip stack as shown, so that the carbon nanofibers 31 conduct heat to the closest edge of the TIM pad 60. In this alternative embodiment, the TIM pad 60 is in a rectangular shape where the area of region A=B=C=D no matter what the W/L ratio of the rectangle. In this alternative embodiment, a chip stack 10 of memory chips is covered. The pattern areas for the chip solder bumps 17 on TIM pad 60 are generally applied after assembling the TIM pad 60. This is to ensure that the area for the chip solder bumps 17 on chips 13 are properly aligned.

Figure 6:
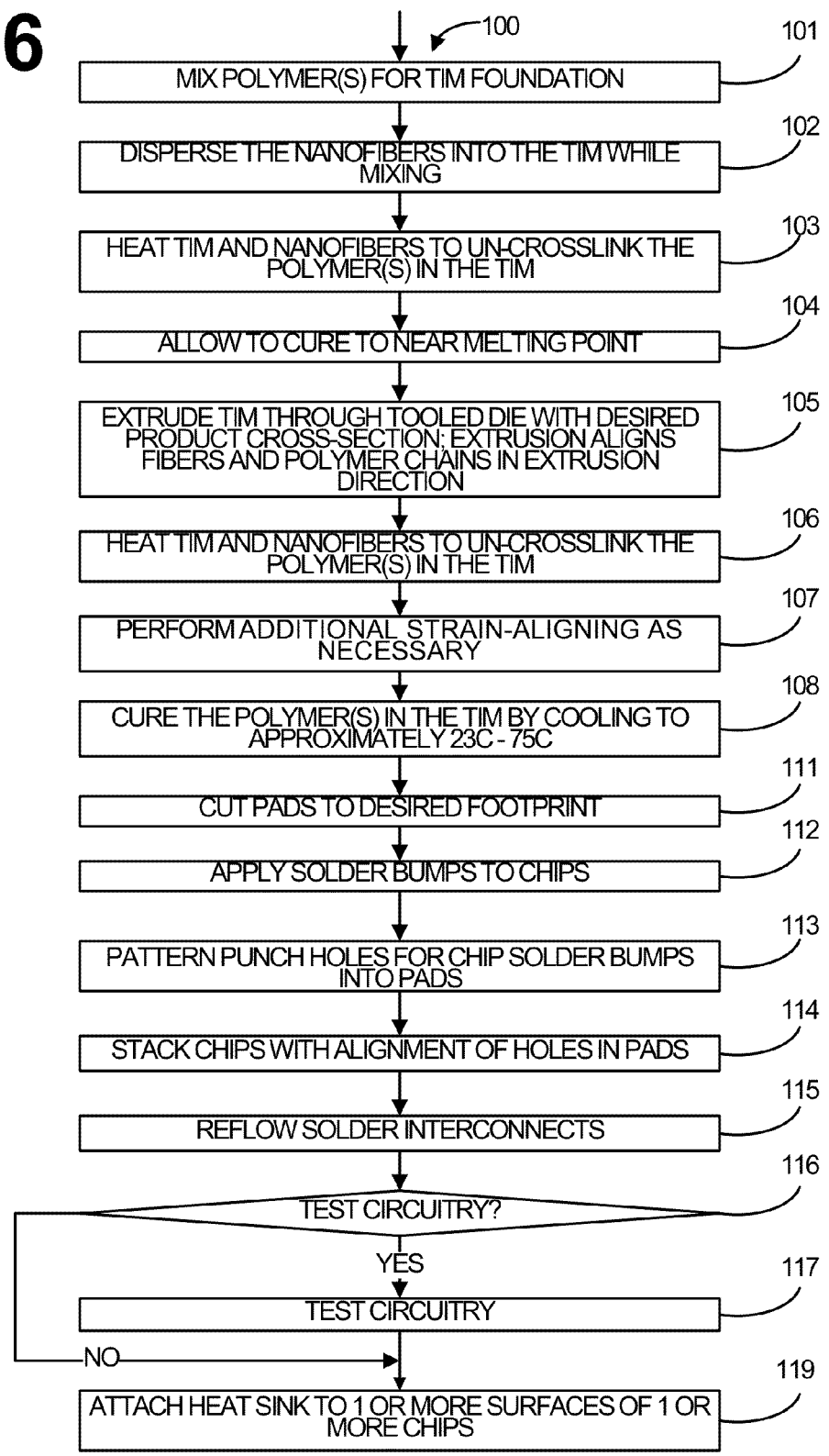
FIG. 6 is a flow chart illustrating an example of a method of forming a silicon device utilizing the thermal interface material with nanofibers heated and extruded through a die to orient the conductive axis of the nanofibers in the desired direction of the present invention.

FIG. 6 is a flow chart illustrating an example of a method of forming a chip stack 10 utilizing the TIM pad 40 with carbon nanofibers 31 horizontally aligned by being heated and then extruded through tooled die 25 with desired product cross-section to orient the conductive axis of the carbon nanofibers 31 in the desired direction of the present invention. Described is a composite material consisting of oriented graphite fibers within a chain-aligned polymer matrix. The graphite fibers act to conduct heat along their longitudinal axis, with the aligned orientation proposed in this invention maximizing the composite's ability to transport heat from one surface to another. In addition, graphite is made up of carbon, one of the most abundant elements on Earth and the fourth most abundant in the universe, thereby making it both economical and readily accessible for use as compared to indium or other rare metals. Graphite has been shown to have outstanding thermal stability, which would make it resistant to the mass-loss and degradation problems that plague some current TIM composites.

In the preferred embodiment, the extrusion aligns carbon nanofibers 31 and polymer chains in extrusion direction. This enhances heat conductivity along the aligned long chains carbon nanofibers 31. In addition, this invention uses a polymer matrix whose molecular chains have been preferentially aligned through processing to be in the same direction as the graphite fibers. It has been shown that polymers with aligned chains demonstrate higher thermal conductivity in the aligned direction by two orders of magnitude or more (depending on the degree of chain alignment) as compared to the same polymer with randomly oriented chains. The use of a chain-aligned polymer binder is in contrast to other conventional TIMs which use polymers whose chains are randomly oriented and thus possess a much lower thermal conductivity, thereby reducing the overall thermal transport performance of their respective composites. In the preferred embodiment, polymers include, but are not limited to, "green" bio-derived polyethylene, fossil-derived polyethylene, and polybenzobisoxazole.

Next, any additional strain-aligning is performed as necessary. There are a couple approaches to forming the individual chips 13(A-D), and subsequent assembly, so the following is just one example of a method of constructing silicon devices in a multilayer chip stack 10 utilizing the thermal interface material pad 40 with aligned carbon nanofibers 31.

At step 101, at least one thermoplastic polymer is used to create the thermal interface material 30 foundation. In the preferred embodiment, polymers include, but are not limited to, "green" bio-derived polyethylene, fossil-derived polyethylene, and polybenzobisoxazole. Any of a number of suitable thermally conductive fillers known to those skilled in the art (e.g., boron nitride, aluminum oxide, etc.) are added to the base polymer at loading levels up to 40 vol %. The filler is isotropically dispersed throughout the polymer matrix via one of several common techniques, including but not limited to, twin screw extrusion. Following dispersion of the thermally conductive filler, the composite material may be heated and extruded to align both the polymer chains as well as the filler.

To prepare the TIM formulation, polymer 1 and polymer 2 are to be used at equal weight percents. While mixing polymer 1 and 2 together, the carbon fiber like structures can be added and mixed. Once mixed in, it can be applied and allowed to cure from room temperature to 70 C. When ready to align, the temperature is brought to approximately 110 C., at which point the polymer will under go a retro diels alder reaction and un-crosslink the polymer, thus reducing the viscosity significantly and allowing for facile alignment via an external field. This will allow for optimal alignment of the carbon nanofibers 31 like structures. Below is an example to demonstrate the retro-diels alder reaction.

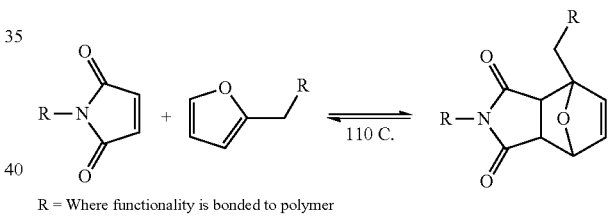

R = Where functionality is bonded to polymer

Below is another example of a TIM formulation, which would allow for rapid viscosity changes to facilitate alignment of the carbon nanofibers 31 like structures.

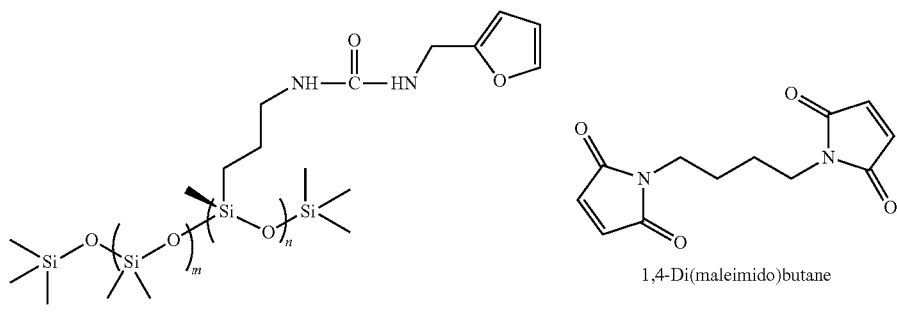

Furan-urea substituted siloxane 1,4-Di(maleimido)butane

-continued

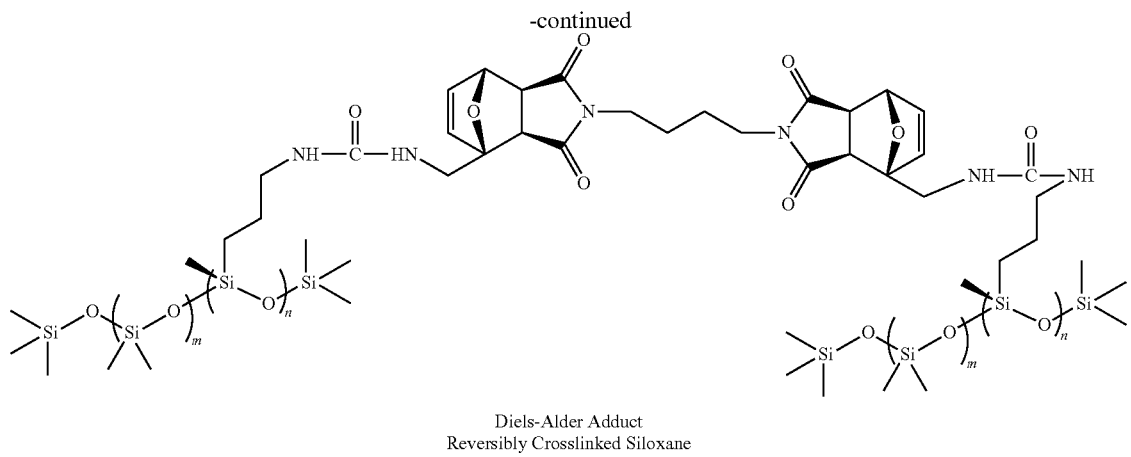

Diels-Alder Adduct
Reversibly Crosslinked Siloxane

Another suitable matrix based on reversible isocyanate reaction with phenol functionality is as follows where the R group can be a wide number of functional groups which will change the reversibility temperature as long as one R group is bound to a polymer to create a TIM formulation:

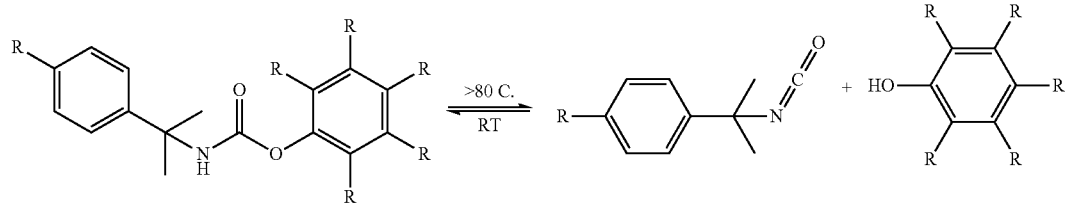

At step 102, the carbon nanofibers 31 are disbursed into the melt using well-established methods. In one embodiment, a high-speed dispersive mixer can be utilized. The amount of carbon nanofibers 31 in the thermal interface material 30 of the present invention will typically be in the range of 4 to 10 weight percent based on the amount of thermal interface material 30, preferably ~5 weight percent. The carbon nanofibers 31 typically are dispersed essentially homogeneously throughout the bulk of the thermal interface material 30. In one alternative embodiment, carbon nanotubes may be substituted for the carbon nanofibers 31.

At step 103, the thermal interface material 30 with the carbon nanofibers 31 is heated to a temperature to un-crosslink the polymers in the thermal interface material 30. In the preferred environment, the temperature of the thermal interface material is heated to and maintained at approximately 110° C.-125° C. At step 104, the thermal interface material 30 containing the carbon nanofibers 31 is cooled to hear the melting point of the polymer which is approximately 23° C.-75° C. in order to recure the polymers in the thermal interface material.

At step 105, the thermal interface material 30 with the carbon nanofibers 31 is extruded through tooled die 25(FIG. 2) with desired product cross-section to orient the conductive axis in the desired direction of the present invention. The graphite fibers act to conduct heat along their longitudinal axis, with the aligned orientation proposed in this invention maximizing the composite's ability to transport heat from one surface to another. In the preferred embodiment, the extrusion aligns carbon nanofibers 31 and polymer chains in extrusion direction. This enhances heat conductivity along the aligned long chains carbon nanofibers 31. In addition, this invention uses a polymer matrix whose molecular chains have been preferentially aligned through processing to be in the same direction as the graphite fibers. It has been shown that polymers with aligned chains demonstrate higher thermal conductivity in the aligned direction by two orders of magnitude or more (depending on the degree of chain alignment) as compared to the same polymer with randomly oriented chains. The use of a chain-aligned polymer binder is in contrast to other conventional TIMs which use polymers whose chains are randomly oriented and thus possess a much lower thermal conductivity, thereby reducing the overall thermal transport performance of their respective composites. In one embodiment, the long axis of the carbon nanofibers 31 are aligned along the conductive axis of the graphite fibers. In another embodiment, the carbon nanofibers 31 are aligned in an orientation perpendicular to the mating surfaces.

At step 106, the thermal interface material 30 with the carbon nanofibers 31 is heated to a temperature to un-crosslink the polymers in the thermal interface material 30. In the preferred environment, the temperature of the thermal interface material is heated to and maintained at approximately 110° C.-125° C.

At step 107, any additional strain-aligning is performed as necessary. In one embodiment, the straining the polymer will also result in chain alignment (i.e. stretch it in its solid state.

At step 108, the thermal interface material 30 containing the carbon nanofibers 31 is cooled to approximately 23° C.-75° C. in order to recure the polymers in the thermal interface material. At step 111, the TIM pads 40 are cut to the desired footprint. TIM pads 40 of appropriately sized geometry (length X, width Y and thickness Z) are cut from the slab of thermal interface material 30 using conventional techniques known to those skilled in the art. The geometry of TIM pad 40 is dictated by the footprint of the integrated circuit to which the TIM pads 40 will be mated.

At step 112, solder bumps 17 are then formed on the on the bottom surface of the chip 13. These solder bumps 17 are generally in alignment with the electrically conductive channels 16 on chip 13 in order to conduct electrical signals. In an alternative embodiment, thermal conductive channels 18 may conduct heat instead of electronic signals and use a solder bump 17 with thermal conductive ability. In one embodiment, a homogenous process could be used to create solders bump 17 for both electrically conductive channels 16 and any thermal conductive channels 18.

At step 113, areas 41 are placed within the pads 42 corresponding with solder bumps 17 on chips 13. This will allow these solder bumps on chip 13 to extend through TIM pads 40 in order to mechanically and electrically connect another chip 13. At step 114, the chips 13 in the chip stack 10 are assembled with the TIM pads 40 in between two adjacent chips 13.

At step 115, the chip stack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with a TIM pad 40A (FIG. 1) in between.

At step 116, it is determined if the circuitry on chips 13 in chip stack 10 are to be tested. If it is determined in step 116 that testing the circuitry in the chip stack 10 is not to be performed, then the method 100 skips to step 119. However, if it is determined at step 114 that the circuitry on chips 13 in chip stack 10 are to be tested, then the circuitry is tested for electrical performance, at step 117.

At step 119, the method 100 attaches a heat sink 11 to one or more surfaces of one or more chips 13.

Figure 7:
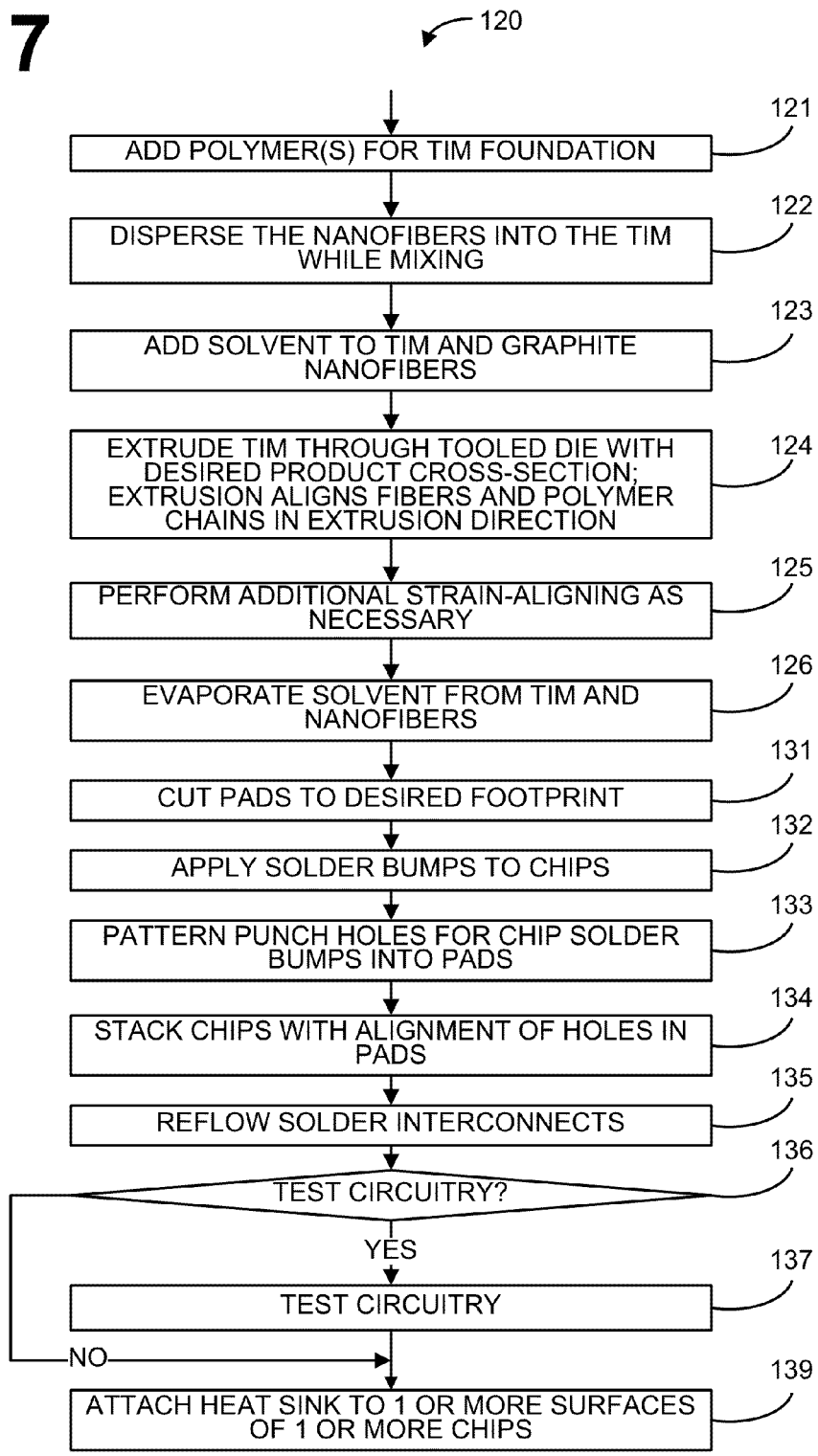
FIG. 7 is a flow chart illustrating an example of a method of constructing silicon devices in a multilayer chip stack 10 utilizing the thermal interface material with carbon nanofibers aligned by using a solvent and a die 25 to extrude the thermal interface material to orient the conductive axis of the carbon nanofibers in the desired direction of the present invention.

FIG. 7 is a flow chart illustrating an example of a method of constructing silicon devices in a multilayer chip stack 10 utilizing the thermal interface material 30 with carbon nanofibers 31 aligned by using a solvent as described above, and a die 25 to extrude the thermal interface material 30 to orient the conductive axis of the carbon nanofibers 31 in the desired direction of the present invention.

At step 121, at least one thermosetting polymer is added to create the thermal interface material 30 foundation. In the preferred embodiment, polymers include, but are not limited to, "green" bio-derived polyethylene, fossil-derived polyethylene, and polybenzobisoxazole. In one embodiment, the thermal interface material 30 is prepared according to the following procedure. To a 25 mL round bottom flask, aminopropylmethyl-dimethylsiloxane copolymer (5 g, 0.002 moles APTES) (commercially available from Gelest Inc.) is added along with anhydrous tetrahydrofuran (THF), a solvent (15 mL), and a stir bar. To this solution, furfuryl isocyante (0.262 g, 0.002 moles) is added drop wise. The reaction is stirred for 24 hrs at 50 C. THF is removed via distillation to yield the desired furfuryl polydimethylsiloxane (PDMS).

In another alternative embodiment, polymer 2 was prepared according to the following procedure. To a 100 mL RBF, a furan protected maleic anhydride (0.5 g, 0.002 moles) is dissolved in 30 mL of benzene followed by the addition of a magnetic stir bar. To this solution, aminopropylmethyl-dimethylsiloxane copolymer (5 g, 0.002 moles APTES) (This polymer is commercially available from Gelest Inc.) is added drop wise along with benzene (20 mL). This reaction is magnetically mixed for 2 hrs at 80 C. Then ZnCl$_2$ (0.27 g, 0.002 moles) is added and magnetically stirred for 30 min. Then a solution of hexamethyldisilazane (HMDS) (0.48 g, 0.003 moles) and benzene (2.0 mL) is added drop wise and reaction was brought to reflux and mixed for 1 h. The solution is filtered and washed with 0.5 N HCl to work up. The organic layer is dried with magnesium sulfate and the volatiles removed by distillation.

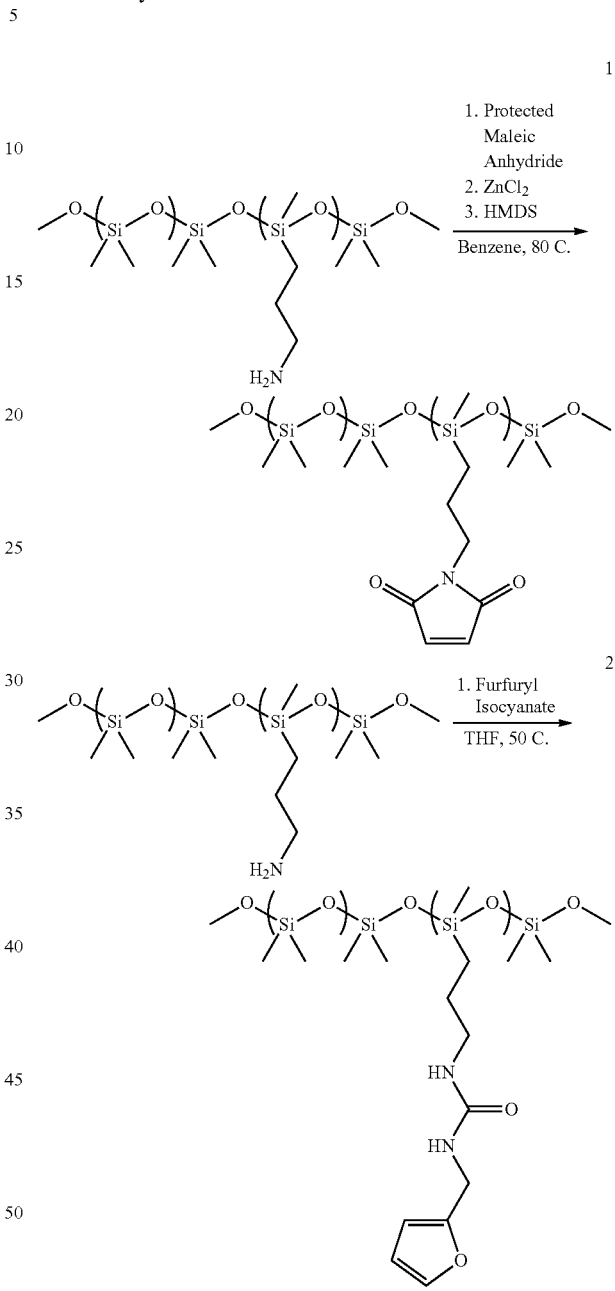

At step 122, the carbon nanofibers 31 are disbursed into the melt using well-established methods. In one embodiment, a high-speed dispersive mixer can be utilized. The amount of carbon nanofibers 31 in the thermal interface material 30 of the present invention will typically be in the range of 4 to 10 weight percent based on the amount of thermal interface material 30, preferably ~5 weight percent. The carbon nanofibers 31 typically are dispersed essentially homogeneously throughout the bulk of the thermal interface material 30. In an alternative embodiment, carbon nanotubes may be substituted for the carbon nanofibers 31.

At step 123, a solvent is added to the thermal interface material 30 with the carbon nanofibers 31 to assist in un-crosslinking the polymers in the thermal interface material 30. In the preferred environment, the solvent is THF or other suitable solvent known to those skilled in the art.

At step 124, the thermal interface material 30 with the carbon nanofibers 31 is extruded through tooled die 25(FIG. 2) with desired product cross-section to orient the conductive axis in the desired direction of the present invention. The carbon nanofibers 31 act to conduct heat along their longitudinal axis, with the aligned orientation proposed in this invention maximizing the composite's ability to transport heat from one surface to another. In the preferred embodiment, the extrusion aligns carbon nanofibers 31 and polymer chains in extrusion direction. This enhances heat conductivity along the aligned long chains carbon nanofibers 31. In addition, this invention uses a polymer matrix whose molecular chains have been preferentially aligned through processing to be in the same direction as the graphite fibers. It has been shown that polymers with aligned chains demonstrate higher thermal conductivity in the aligned direction by two orders of magnitude or more (depending on the degree of chain alignment) as compared to the same polymer with randomly oriented chains. The use of a chain-aligned polymer binder is in contrast to other conventional TIMs which use polymers whose chains are randomly oriented and thus possess a much lower thermal conductivity, thereby reducing the overall thermal transport performance of their respective composites. In one embodiment, the long axis of the carbon nanofibers 31 are aligned along the conductive axis of the graphite fibers. In another embodiment, the carbon nanofibers 31 are aligned in an orientation perpendicular to the mating surfaces.

At step 125, any additional strain-aligning is performed as necessary. In one embodiment, the straining the polymer will also result in chain alignment (i.e. stretch it in its solid state. At step 126, the solvent within the thermal interface material 30 containing the carbon nanofibers 31 is evaporated off. In one embodiment, a vacuum stripping method can be used, where the material is simply subjected to a vacuum.

At step 131, the TIM pads 40 are cut to the desired footprint. TIM pads 40 of appropriately sized geometry (length X, width Y and thickness Z) are cut from the slab of thermal interface material 30 using conventional techniques known to those skilled in the art. The geometry of TIM pad 40 is dictated by the footprint of the integrated circuit to which the TIM pads 40 will be mated.

At step 132, solder bumps 17 are then formed on the bottom surface of the chip 13. These solder bumps 17 are generally in alignment with the electrically conductive channels 16 on chip 13 in order to conduct electrical signals. In an alternative embodiment, thermal conductive channels 18 may conduct heat instead of electronic signals and use a solder bump 17 with thermal conductive ability. In one embodiment, a homogenous process could be used to create solder bumps 17 for both electrically conductive channels 16 and any thermal conductive channels 18.

At step 133, areas 41 are placed within the pads 42 corresponding with solder bumps 17 on chips 13. This will allow these solder bumps on chip 13 to extend through TIM pads 40 in order to mechanically and electrically connect another chip 13. At step 134, the chips 13 in the chip stack 10 are assembled with the TIM pads 40 in between two adjacent chips 13.

At step 135, the chip stack 10 is heated to a reflow temperature, at which point the solder in the solder bumps 17 flows. Subsequent cooling results in a fixed, electrically conductive joint to be formed between the electrically conductive channels 16. An example of this is to have the bottom surface of a first chip 13A coupled to a top surface of a second chip 13B with a TIM pad 40A (FIG. 1) in between.

At step 136, it is determined if the circuitry on chips 13 in chip stack 10 are to be tested. If it is determined in step 136 that testing the circuitry in the chip stack 10 is not to be performed, then the method 120 skips to step 139. However, if it is determined at step 136 that the circuitry on chips 13 in chip stack 10 are to be tested, then the circuitry is tested for electrical performance, at step 137.

At step 139, the method 120 attaches a heat sink 11 to one or more surfaces of one or more chips 13.

The terminology used herein is for describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The flowchart and block diagrams in the Figures illustrate the functionality, and operation of possible implementations of systems and methods according to various embodiments of the present invention. In this regard, each block in the flowchart or block diagrams may represent a module, segment, or task to be performed, which comprises one or more executable steps for implementing the specified function(s). It should also be noted that, in some alternative implementations, the functions noted in the block may occur out of the order noted in the Figures. For example, two blocks shown in succession may in fact be performed substantially concurrently or the blocks may sometimes be executed in the reverse order, depending upon the functionality involved.

It should be emphasized that the above-described embodiments of the present invention, particularly any "preferred" embodiments, are merely possible examples of implementations set forth for a clear understanding of the principles of the invention. Many variations and modifications may be made to the above-described embodiment(s) of the invention without departing substantially from the spirit and principles of the invention. All such modifications and variations are intended to be included herein within the scope of this disclosure and the present invention and protected by the following claims.

The invention claimed is:

1. A method for aligning a plurality of nanofibers in a thermal interface material to enhance performance of the thermal interface material, comprising:
    adding at least one thermosetting polymer to the thermal interface material, wherein at least one of the at least one thermosetting polymer has a polymer chain;
    dispersing the plurality of nanofibers into the thermal interface material;
    un-crosslinking the at least one thermosetting polymer in the thermal interface material; and
    extruding the thermal interface material through a die to orient the conductive axis of the nanofibers and the polymer chains in the desired direction; and
    re-crosslinking the at least one thermosetting polymer in the thermal interface material.

2. The method of claim 1, wherein the un-crosslinking is accomplished by heating the thermal interface material, and the re-crosslinking is accomplished by cooling the thermal interface material.

3. The method of claim 2, wherein the heating is to at least 110° C., and the cooling is to approximately a range of 23° C. to 75° C.

4. The method of claim 1, wherein the un-crosslinking is accomplished by adding a solvent to the thermal interface material, and the re-crosslinking is accomplished by evaporating off the solvent in the thermal interface material.

5. The method of claim 1, wherein the plurality of nanofibers and the polymer chains are aligned parallel to mating surfaces of the thermal interface material.

6. The method of claim 1, wherein the plurality of nanofibers and the polymer chains are aligned perpendicular to mating surfaces of the thermal interface material.

7. The method of claim 1, comprising:
cutting the thermal interface material into a thermal interface material pad, and wherein each of the plurality of nanofibers and the polymer chains in the thermal interface material pad are arranged so that both ends of each of the plurality of nanofibers and the polymer chains are perpendicular to an edge of the thermal interface material pad closest to each of the plurality of nanofibers.

8. The method of claim 1, wherein the plurality of nanofibers are a plurality of nanotubes.

9. A system for aligning a plurality of nanofibers in a thermal interface material to enhance performance of the thermal interface material, comprising:
a means for adding at least one thermosetting polymer to the thermal interface material, wherein at least one of the at least one thermosetting polymer has a polymer chain;
a means for dispersing the plurality of nanofibers into the thermal interface material;
a means for un-crosslinking the at least one thermosetting polymer in the thermal interface material; and
a means for extruding the thermal interface material through a die to orient the conductive axis of the nanofibers in the desired direction with that of the aligned polymer chains; and
a means for re-crosslinking the at least one thermosetting polymer in the thermal interface material.

10. The system of claim 9, wherein the un-crosslinking is by heating the thermal interface material, and the re-crosslinking is by cooling the thermal interface material.

11. The system of claim 10, wherein the heating is to at least 110° C. and the cooling is to approximately a range of 23° C. to 75° C.

12. The system of claim 10, wherein the un-crosslinking is by adding a solvent to the thermal interface material, and the re-crosslinking is accomplished by evaporating off the solvent in the thermal interface material.

13. The system of claim 9, wherein the plurality of nanofibers and the polymer chains are aligned parallel to mating surfaces of the thermal interface material.

14. The system of claim 9, the plurality of nanofibers and the polymer chains are aligned perpendicular to mating surfaces of the thermal interface material.

15. The system of claim 9, further comprising:
means for cutting the thermal interface material into a thermal interface material pad, and wherein each of the plurality of nanofibers and the polymer chains in the thermal interface material pad are arranged so that both ends of each of the plurality of nanofibers are perpendicular to an edge of the thermal interface material pad closest to each of the plurality of nanofibers.

16. The system of claim 9, wherein the plurality of nanofibers are a plurality of nanotubes.

* * * * *